(12) United States Patent
Koch et al.

(10) Patent No.: US 7,423,408 B2
(45) Date of Patent: Sep. 9, 2008

(54) MONITORING DEVICE AND METHOD FOR DETERMINING AT LEAST ONE CHARACTERISTIC VARIABLE FOR THE STATE OF A BATTERY

(75) Inventors: Ingo Koch, Hameln (DE); Helmut Laig-Hoerstebrock, Frankfurt (DE); Eberhard Meissner, Wunstorf (DE); Ursula Teutsch, Bad Soden (DE)

(73) Assignee: VB Autobatterie GmbH, Hannover (DE)

( * ) Notice: Subject to any disclaimer, the term of this patent is extended or adjusted under 35 U.S.C. 154(b) by 600 days.

(21) Appl. No.: 11/060,637

(22) Filed: Feb. 17, 2005

(65) Prior Publication Data

US 2005/0189920 A1 Sep. 1, 2005

(30) Foreign Application Priority Data

Feb. 18, 2004 (DE) .................. 10 2004 007 904

(51) Int. Cl.
*H01M 10/44* (2006.01)
(52) U.S. Cl. .................. 320/132; 320/149; 702/63; 324/426; 324/427; 324/430; 324/431; 324/433
(58) Field of Classification Search .................. 320/132, 320/149; 702/63; 324/426, 427, 430, 431, 324/433
See application file for complete search history.

(56) References Cited

U.S. PATENT DOCUMENTS

| | | | |
|---|---|---|---|
| 3,906,329 A | 9/1975 | Bader | |
| 4,153,867 A | 5/1979 | Jungfer et al. | |
| 4,193,025 A | 3/1980 | Frailing et al. | |
| 4,207,611 A | 6/1980 | Gordon | |
| 4,322,685 A | 3/1982 | Frailing et al. | |
| 4,433,294 A * | 2/1984 | Windebank | 324/426 |
| 4,595,880 A | 6/1986 | Patil | |

(Continued)

FOREIGN PATENT DOCUMENTS

DE 2 242 510 C3 4/1974

(Continued)

OTHER PUBLICATIONS

EPO,EPO Search Report, EP 05001383, May 16, 2005, p. 1-2.*

(Continued)

*Primary Examiner*—Bao Q. Vu
*Assistant Examiner*—Jue Zhang
(74) *Attorney, Agent, or Firm*—Foley & Lardner LLP (57) ABSTRACT

A method for determining at least one characteristic variable for the state of a battery includes: (a) determining the charge throughput of the battery per time step; having, (b) determining a first characteristic figure in order to describe the stratification of the electrolyte concentration in the battery on the basis of a defined initial state for an as-new battery, and of a second characteristic figure in order to describe the stratification of the state of charge in the battery on the basis of a defined initial value for an as-new battery during operation of the battery, in which (c) in each time step, the first characteristic figure and the second characteristic figure are adapted as a function of the charge throughput from the instantaneous state of the battery, and at least one characteristic variable is determined from the first and the second characteristic figure.

34 Claims, 6 Drawing Sheets

U.S. PATENT DOCUMENTS

| | | | |
|---|---|---|---|
| 4,642,600 A | 2/1987 | Gummelt et al. | |
| 4,659,977 A | 4/1987 | Kissel et al. | |
| 4,665,370 A | 5/1987 | Holland | |
| 4,719,427 A | 1/1988 | Morishita et al. | |
| 4,816,736 A | 3/1989 | Dougherty et al. | |
| 4,876,513 A | 10/1989 | Brilmyer et al. | |
| 4,888,716 A | 12/1989 | Ueno | |
| 4,937,528 A | 6/1990 | Palanisamy | |
| 4,943,777 A | 7/1990 | Nakamura et al. | |
| 4,952,861 A | 8/1990 | Horn | |
| 5,002,840 A | 3/1991 | Klebenow et al. | |
| 5,032,825 A | 7/1991 | Kuznicki | |
| 5,055,656 A | 10/1991 | Farah et al. | |
| 5,079,716 A | 1/1992 | Lenhardt et al. | |
| 5,130,699 A | 7/1992 | Reher et al. | |
| 5,159,272 A | 10/1992 | Rao et al. | |
| 5,162,164 A | 11/1992 | Dougherty et al. | |
| 5,193,067 A * | 3/1993 | Sato et al. | 702/63 |
| 5,204,610 A | 4/1993 | Pierson et al. | |
| 5,223,351 A | 6/1993 | Wruck | |
| 5,280,231 A | 1/1994 | Kato et al. | |
| 5,281,919 A * | 1/1994 | Palanisamy | 324/427 |
| 5,316,868 A | 5/1994 | Dougherty et al. | |
| 5,321,627 A | 6/1994 | Reher | |
| 5,352,968 A | 10/1994 | Reni et al. | |
| 5,381,096 A | 1/1995 | Hirzel | |
| 5,404,129 A | 4/1995 | Novak et al. | |
| 5,412,323 A * | 5/1995 | Kato et al. | 324/429 |
| 5,416,402 A | 5/1995 | Reher et al. | |
| 5,428,560 A | 6/1995 | Leon et al. | |
| 5,439,577 A | 8/1995 | Weres et al. | |
| 5,488,283 A | 1/1996 | Dougherty et al. | |
| 5,549,984 A | 8/1996 | Dougherty | |
| 5,550,474 A * | 8/1996 | Dahl | 324/432 |
| 5,552,642 A | 9/1996 | Dougherty et al. | |
| 5,563,496 A | 10/1996 | McClure | |
| 5,572,136 A | 11/1996 | Champlin | |
| 5,578,915 A | 11/1996 | Crouch, Jr. et al. | |
| 5,656,915 A | 8/1997 | Eaves | |
| 5,680,050 A | 10/1997 | Kawai et al. | |
| 5,698,965 A | 12/1997 | York | |
| 5,721,688 A | 2/1998 | Bramwell | |
| 5,744,936 A | 4/1998 | Kawakami | |
| 5,744,963 A | 4/1998 | Arai et al. | |
| 5,773,977 A | 6/1998 | Dougherty | |
| 5,808,367 A | 9/1998 | Akagi et al. | |
| 5,808,445 A | 9/1998 | Aylor et al. | |
| 5,818,116 A | 10/1998 | Nakae et al. | |
| 5,818,333 A | 10/1998 | Yaffe et al. | |
| 5,847,566 A * | 12/1998 | Marritt et al. | 324/427 |
| 5,896,023 A | 4/1999 | Richter | |
| 5,898,292 A | 4/1999 | Takemoto et al. | |
| 5,936,383 A | 8/1999 | Ng et al. | |
| 5,965,954 A | 10/1999 | Johnson et al. | |
| 5,977,654 A | 11/1999 | Johnson et al. | |
| 5,990,660 A | 11/1999 | Meissner | |
| 6,016,047 A | 1/2000 | Notten et al. | |
| 6,037,749 A | 3/2000 | Parsonage | |
| 6,037,777 A | 3/2000 | Champlin | |
| 6,057,666 A | 5/2000 | Dougherty et al. | |
| 6,087,808 A | 7/2000 | Pritchard | |
| 6,091,325 A | 7/2000 | Zur et al. | |
| 6,103,403 A | 8/2000 | Grigorian et al. | |
| 6,118,252 A | 9/2000 | Richter | |
| 6,118,275 A | 9/2000 | Yoon et al. | |
| 6,144,185 A | 11/2000 | Dougherty et al. | |
| 6,160,382 A | 12/2000 | Yoon et al. | |
| 6,222,341 B1 | 4/2001 | Dougherty et al. | |
| 6,268,712 B1 | 7/2001 | Laig-Horstebrock et al. | |
| 6,271,642 B1 | 8/2001 | Dougherty et al. | |
| 6,296,593 B1 | 10/2001 | Gotou et al. | |
| 6,300,763 B1 | 10/2001 | Kwok | |
| 6,304,059 B1 | 10/2001 | Chalasani et al. | |
| 6,331,762 B1 | 12/2001 | Bertness | |
| 6,369,578 B1 | 4/2002 | Crouch, Jr. et al. | |
| 6,388,421 B2 | 5/2002 | Abe | |
| 6,388,450 B2 | 5/2002 | Richter et al. | |
| 6,392,389 B1 | 5/2002 | Kohler | |
| 6,392,414 B2 | 5/2002 | Bertness | |
| 6,392,415 B2 | 5/2002 | Laig-Horstebrock et al. | |
| 6,417,668 B1 | 7/2002 | Howard et al. | |
| 6,424,157 B1 | 7/2002 | Gollomp et al. | |
| 6,441,585 B1 | 8/2002 | Bertness | |
| 6,445,158 B1 | 9/2002 | Bertness et al. | |
| 6,452,361 B2 | 9/2002 | Dougherty et al. | |
| 6,472,875 B1 | 10/2002 | Meyer | |
| 6,495,990 B2 | 12/2002 | Champlin | |
| 6,507,194 B2 | 1/2003 | Suzuki | |
| 6,515,452 B2 | 2/2003 | Choo | |
| 6,515,456 B1 | 2/2003 | Mixon | |
| 6,522,148 B2 | 2/2003 | Ochiai et al. | |
| 6,534,954 B1 * | 3/2003 | Plett | 320/132 |
| 6,534,992 B2 | 3/2003 | Meissner et al. | |
| 6,556,019 B2 * | 4/2003 | Bertness | 324/426 |
| 6,600,237 B1 | 7/2003 | Meissner | |
| 6,600,293 B2 | 7/2003 | Kikuchi | |
| 6,608,482 B2 | 8/2003 | Sakai et al. | |
| 6,653,818 B2 | 11/2003 | Laig-Horstebrock et al. | |
| 7,253,587 B2 * | 8/2007 | Meissner | 320/132 |
| 2002/0008495 A1 | 1/2002 | Dougherty et al. | |
| 2002/0026252 A1 | 2/2002 | Wruck et al. | |
| 2002/0031700 A1 | 3/2002 | Wruck et al. | |
| 2002/0175687 A1 * | 11/2002 | Bertness | 324/426 |
| 2003/0047366 A1 | 3/2003 | Andrew et al. | |
| 2003/0082440 A1 | 5/2003 | Mrotek et al. | |
| 2003/0142228 A1 | 7/2003 | Flach et al. | |
| 2003/0236656 A1 | 12/2003 | Dougherty | |
| 2004/0021468 A1 | 2/2004 | Dougherty et al. | |

FOREIGN PATENT DOCUMENTS

| | | |
|---|---|---|
| DE | 39 01 680 A1 | 3/1990 |
| DE | 40 07 883 A1 | 9/1991 |
| DE | 44 14 134 A1 | 11/1994 |
| DE | 43 39 568 A1 | 5/1995 |
| DE | 689 24 169 T2 | 3/1996 |
| DE | 195 40 827 A1 | 5/1996 |
| DE | 195 43 874 A1 | 5/1996 |
| DE | 197 50 309 A1 | 5/1999 |
| DE | 691 31 276 T2 | 12/1999 |
| DE | 198 47 648 A1 | 4/2000 |
| DE | 694 23 918 T2 | 8/2000 |
| DE | 199 52 693 A1 | 5/2001 |
| DE | 199 60 761 C1 | 5/2001 |
| DE | 93 21 638 U1 | 8/2001 |
| DE | 100 21 161 A1 | 10/2001 |
| DE | 101 03 848 A1 | 8/2002 |
| DE | 699 00 638 T2 | 8/2002 |
| EP | 1 116 958 A2 | 7/2001 |
| EP | 1 120 641 A2 | 8/2001 |
| WO | WO 99/17128 | 4/1999 |
| WO | WO 9966340 | 12/1999 |
| WO | WO 00/04620 | 1/2000 |
| WO | WO 0115023 | 3/2001 |
| WO | WO 03/001224 | 1/2003 |

OTHER PUBLICATIONS

Baert, D & Vervaet, A., "Lead-Acid Battery Model for the Derivation of Peukert's Law," Electrochimica Acta, Elsevier Science Publishers, Barking, GB, Vol. 44, No. 20, pp. 3491-3504 XP004168624 ISSN: 0013-4686.

Battery Alert, Ltd., Battery Deterioration Warning Device, 12 Volt Model (BA101) Advertisement (2 sheets).

Battery Evaluation Reports, s.e. Ross Laboratories, Inc., Apr. 1999 (1 page).

Bosch and the New E-Class, Electronic Battery Management System, Focus on Electronics, Nov. 2002 (1 sheet).

Brooke, L., Resin Keeps Batteries Cool, A1 Inside Magazine, Nov. 1988, p. 55.

Conference Proceedings, Intelec '86— International Telecommunications Energy Conference, Determining the End of Battery Life—Sheldon DeBardelaben, New York Telephone Company, bearing a designation "Oct. 19-22, 1986." (6 sheets).

Forcast Review, The Battery Man, Nov. 1996 p. 21.

Hoover, J. Failure Modes of Batteries Removed from Service, A Presentation at the 107th Convention of Battery Council International, Apr. 30-May 3, 1995, p. 62.

How It Works: Reed Switch Motor, http://members.tripod.com/simplemotor/rsmotor.htm, available at least by Jan. 6, 2003, 4 pages.

HSR-003 Application Notes, Hermetic Switch, Inc., Highway 92, Post Office Box 2220, Chickasha, OK 73023, http://www.hermeticswitch.com/RS_frm.htm, available at least by Jan. 6, 2003 (1 page).

Intelec '88—Tenth International communications Energy Conference, "A look at the Impedance of a Cell—S.L. DeBardelaaben, New York Telephone Company," bearing a designation "Oct. 30-Nov. 2, 1988." (6 sheets).

International Search Report for PCT/US02/19760 (international filing date Jun. 21, 2002), date of mailing Oct. 10, 2002.

Journal of Applied Electrochemistry, vol. 10 No. 1, Jan. 1980—The Impedance of Electrical Storage Cells—N.A. Hampson, s.A.G.R. Karunathilaka, Department of Chemistry, R. Leek, Department of Electronic and Electrical Engineering, University of Technology, Loughborough, Liecestershire, UK (11 sheets).

Lehman, A., "Electrical Battery Model For Leo Application Based on Absolute Instantaneous State of Charge," Proceedings of the European Space Power Conference held in Madrid, Spain, Oct 2-6, 1989, ESA Publications, NL, vol. 1, pp. 173-178.

Lürkens et al., Ladezustandsschätzuntt von Bleibatterien mit Hilfe des *Kalman*-Filters, etz Archiv, vol. 8 (1986), Issue 7, pp. 231-236.

Mauracher, P. & Karden, E., "Dynamic Modelling of Lead/Acid Batteries Using Impedance Spectroscopy for Parameter Identification," Journal of Power Sources, Elsevier Sequoia S.A., Lausanne, Ch., vol. 67 (1997) No. 1-2, pp. 69-84, XP004095174 ISSN: 0378-7753, p. 70, line 11; p. 82, line 5, figures 2, 3, 12.

Mayer, D. et al., "Modelling and Analysis of Lead Acid Battery Operation," Ecole des Mines de Paris, XP010092137, pp. 1-3.

OnGuard™ XT Battery State-of-Health Monitor, 2003 Midtronics, Inc. P/N 156-983A (2 sheets).

Reed Relay Technical & Applications Information, COTO Technology, 55 Dupont Drive, Providence, RI, pgs. http://www.cotorelay.com/ReedTech.pdf, available at least by Jan. 6, 2003, 37-43.

Robbins, Tim & Hawkins, John, "Battery Model For Over-Current Protection Simulation of DC Distribution Systems," Telecommunications Energy Conference, 1994, Intelec '94, 16th International Vancouver, BC, Canada Oct. 30-Nov. 3, 1994, New York, NY, IEEE, pp. 307-314 XP001036407 ISBN: 0-7803-2034-4.

Stan Gibilisco and Neil Sclater, Co-Editors-in-Chief, "Rectifier Bridge," Encyclopedia of Electronics, 2nd Edition, TAB Professional and Reference Books, 1996, pp. 708-711.

Willibert Schleuter, Das elektrische Ersatzschaltbild des Bleiakkumulators unter Berücksichtigungerzwungener Elektrolytströmung, etz Archiv, vol. 4 (1982), Issue 7, pp. 213-218.

* cited by examiner

Charge reversal in a battery with acid stratification in a rest phase
Profile of the characteristic figures KS and KL

Fig. 6

Charge reversal in a battery with acid stratification in a rest phase
Profile of the no-load battery voltage

Fig. 7

MONITORING DEVICE AND METHOD FOR DETERMINING AT LEAST ONE CHARACTERISTIC VARIABLE FOR THE STATE OF A BATTERY

CROSS-REFERENCE TO RELATED PATENT APPLICATIONS

The present application claims the benefit of German Priority Application DE 10 2004 007 904.8, filed Feb. 18, 2004. German Priority Application DE 10 2004 007 904.8, filed Feb. 18, 2004, including the specification, drawings, claims and abstract, is incorporated herein by reference in its entirety.

BACKGROUND

The present invention relates generally to the field of devices and methods for monitoring batteries. More specifically, the present invention relates to a method for determining at least one characteristic variable for the state of an electrochemical energy storage battery. The present invention also relates to a monitoring device for such a battery.

The wear of energy storage batteries can either be determined by deducing a state or a behavior of the energy storage battery from the operating history, or else by deducing a state or a behavior of the energy storage battery from measurement findings.

DE 195 40 827 C1 discloses a method for determination of aging, in which a family of characteristics for battery aging is evaluated as a function of the amount of discharge per discharge cycle as a battery aging influencing variable. The method takes account of the influencing variables of "discharging" and "discharge depth," so that the amount of charge discharged is used to determine aging.

Furthermore, U.S. Pat. No. 6,103,408 describes an aging clock whose frequency is varied as a function of at least one characteristic value of the energy storage battery. By way of example, the frequency of the aging clock may be raised when the electrolyte temperature increases and when the discrepancy between the terminal voltage and the rest voltage increases.

Various different methods are known for measurement of the state of charge and for determination of the load response of energy storage batteries. For example, integrating measurement devices are thus used (ampere-hour (Ah) counters), with the charging current being taken into account, possibly weighted with a fixed charging factor. Since the usable capacity of an energy storage battery is highly dependent on the magnitude of the discharge current and the temperature, even a method such as this does not allow a satisfactory conclusion to be drawn about the usable capacity which can still be drawn from the battery.

By way of example, DE 22 42 510 C1 discloses, in the case of a method for measurement of the state of charge, the charging current being weighted with a factor which is dependent on the temperature and on the state of charge of the battery itself.

DE 40 07 883 A1 describes a method in which the starting capability of an energy storage battery is determined by measurement of the battery terminal voltage and of the battery temperature, and by comparison with a family of curves for the state of charge that is applicable to the battery type to be tested.

DE 195 43 874 A1 discloses a calculation method for the discharge characteristic and remaining capacity measurement for an energy storage battery in which current, voltage, and temperature are likewise measured, with the discharge characteristic being approximated by a mathematical function with a curved surface.

DE 39 01 680 C1 describes a method for monitoring the cold-starting capability of a starter battery in which the starter battery is loaded with a resistance at times. The voltage dropped across the resistance is measured and is compared with empirical values in order to determine whether the cold-starting capability of the starter battery is still sufficient. The starting process is in this case used to load the starter battery.

Furthermore, DE 43 39 568 A1 discloses a method for determination of the state of charge of a motor vehicle starter battery in which battery current and rest voltage are measured and the state of charge is deduced from them. In this case, the battery temperature is also taken into account. The charging currents measured during various time periods are compared with one another, and are used to determine the remaining capacity.

DE 198 47 648 A1 describes a method for learning a relationship between the rest voltage and the state of charge of an energy storage battery in order to estimate the storage capability. A measure of the electrolyte capacity of the electrolyte in the energy storage battery is determined from the relationship between the rest voltage difference and the amount of current produced during the loading phase. This makes use of the fact that the rest voltage rises approximately linearly with the state of charge in higher state of charge ranges which are relevant in practice.

One problem in determining the state of an electrochemical energy storage battery using known methods is that wear occurs both while discharging and charging rechargeable energy storage batteries as well as when they are stored without any load applied, and the relevant wear factors are not all taken into account in the process.

In the case of a lead-acid rechargeable battery, the electrolyte is in the form of dilute sulfuric acid, that is to say, a solution of sulfuric acid in water. Typically, this is an approximately 4 to 5 molar solution when in the fully charged state. During the discharge reaction, sulfuric acid is consumed at both electrodes in the electrolyte on the basis of the reaction equation:

with $H_2O$ also being formed at a positive electrode. The concentration and the relative density of the electrolyte fall during discharging, while they rise again during the charging reaction, which takes place in the opposite direction.

If the sulfuric acid which is formed during the charging reaction has a convention capability in the earth's field of gravity, then it has the tendency to fall in layers to the bottom of the cell vessel of the cells in the lead-acid rechargeable battery. The electrolyte in the lower area of the respective cell vessel thus has a higher concentration than that in the upper area of the cell vessel. In the case of a lead-acid rechargeable battery, this state is referred to as acid stratification.

Since both the charging/discharge reaction and the parasitic reactions, such as gas development, corrosion etc., are in general influenced by the electrolyte concentration, acid stratification leads to non-uniformity of the state of the cell. However, known methods assess only monotonally developing aging characteristic variables, and do not take account of the effect of stratification of the electrolyte concentration, which can increase and, in certain situations, can also decrease again.

It would be advantageous to provide an improved method for determining at least one characteristic variable for the state of an electrochemical energy storage battery which also takes into account the effect of electrolyte stratification. It would also be advantageous to provide a device (e.g., a monitoring device) for carrying out such a method. It would be desirable to provide a system and/or method that provides any one or more of these or other advantageous features which may be apparent to those reviewing this document.

SUMMARY

The present invention relates to a method for determining at least one characteristic variable for the state of an electrochemical energy storage battery. The method includes (a) determining the charge throughput of the energy storage battery per time step; comprising (b) determining a first characteristic figure in order to describe the stratification of the electrolyte concentration in the energy storage battery on the basis of a defined initial state for an as-new energy storage battery, and of a second characteristic figure in order to describe the stratification of the state of charge in the energy storage battery on the basis of a defined initial value for an as-new energy storage battery during operation of the energy storage battery, in which (c) in each time step, the first characteristic figure and the second characteristic figure are adapted as a function of the charge throughput from the instantaneous state of the energy storage battery, which is characterized by the state of charge of the electrodes, the electrolyte concentration in the energy storage battery and the first and second characteristic figures, and at least one characteristic variable is determined from the first and the second characteristic figure.

The present invention also relates to a monitoring device for an energy storage battery having a unit for determining the charge throughput ($\Delta Q$) of the energy storage battery and having evaluation means, wherein the evaluation means are designed to carry out a method that includes (a) determining the charge throughput of the energy storage battery per time step; comprising (b) determining a first characteristic figure in order to describe the stratification of the electrolyte concentration in the energy storage battery on the basis of a defined initial state for an as-new energy storage battery, and of a second characteristic figure in order to describe the stratification of the state of charge in the energy storage battery on the basis of a defined initial value for an as-new energy storage battery during operation of the energy storage battery, in which (c) in each time step, the first characteristic figure and the second characteristic figure are adapted as a function of the charge throughput from the instantaneous state of the energy storage battery, which is characterized by the state of charge of the electrodes, the electrolyte concentration in the energy storage battery and the first and second characteristic figures, and at least one characteristic variable is determined from the first and the second characteristic figure.

BRIEF DESCRIPTION OF THE DRAWINGS

FIG. 5 shows a flowchart of the method in the OVER-CHARGING or gassing operating state.

DETAILED DESCRIPTION OF EXEMPLARY EMBODIMENTS

According to an exemplary embodiment, a method for determining at least one characteristic variable for the state of an electrochemical energy storage battery includes the following steps: a) determination of the charge throughput $\Delta Q$ of the energy storage battery per time step $\Delta t$; b) determination of a first characteristic figure KS in order to describe the stratification of the electrolyte concentration in the energy storage battery on the basis of a defined initial state $KS_0$ for an as-new energy storage battery, and of a second characteristic figure KL in order to describe the stratification of the state of charge SOC in the energy storage battery on the basis of a defined initial value $KL_0$ for an as-new energy storage battery during operation of the energy storage battery, in which c) in each time step $\Delta t$, the first characteristic figure KS and the second characteristic figure KL are adapted as a function of the charge throughput $\Delta Q$ from the instantaneous state of the energy storage battery, which is characterized by the state of charge of the electrodes, the electrolyte concentration in the energy storage battery and the first and second characteristic figures KS and KL, and at least one characteristic variable is determined from the first and the second characteristic figures KS and KL.

The method is particularly suitable for lead-acid rechargeable batteries with liquid electrolytes without, however, being restricted to energy storage batteries of types such as these.

The definition of a first and a second characteristic figure now makes it possible to predict the performance of an electrochemical energy storage battery, in particular the storage capability, the state of charge, the voltage response when loaded with currents, the voltage response in the no-load state (internal charge rearrangement), or the degree of wear, just by determining and assessing the charge throughput for defined time steps. The first and second characteristic figures KS and KL that are obtained are used for this purpose.

On the one hand, at least one of the characteristic figures obtained can be used for this purpose in order to initiate a measure, for example a maintenance instruction or replacement instruction, or control of a charging device, a pump or a temperature control device. It is also possible to use known methods which can now be upgraded by a measure for the extent of electrolyte stratification by means of the first and second characteristic figures KS and KL.

The increase in the first characteristic figure for net charging per time step and the reduction in the first characteristic figure and simultaneous increase in the second characteristic figure for net discharging is in this case suitable to describe the wear of the energy storage battery over its life.

A distinction is preferably drawn between at least two of the following operating phases for adaptation of the first and the second characteristic figures: a) ZERO-CURRENT, when the magnitude of the charge throughput per time step is less than a threshold value; b) DISCHARGING, when the charge throughput per time step is negative and whose magnitude is greater than the threshold value; c) CHARGING, when the charge throughput per time step is positive and its magnitude is greater than the threshold value and OVERCHARGING is not occurring; and d) OVERCHARGING, when the charge throughput per time step is positive and its magnitude is greater than the threshold value and, at the same time, the first characteristic figure is in the vicinity of the initial value with respect to the value range, or when gas development which exceeds a defined gassing threshold value is identified from the charge throughput and the state of charge of the energy storage battery.

This makes it possible to take account of the different influences of said operating phases on the formation and reversal of electrolyte stratification in conjunction with other wear factors by adaptation of the characteristic figures.

The threshold value is set below the 20-hour current of the energy storage battery according to an exemplary embodiment. The threshold value is set below the 100-hour current of the energy storage battery according to another exemplary embodiment.

The first and second characteristic figures are preferably adapted as a function of the identified operating states as follows:

The first characteristic figure is increased in the CHARGING operating state. The second characteristic figure is increased whenever the first characteristic figure is not close to the initial value with respect to its value range, and the sum of the value for the state of charge and the second characteristic figure has a value which is not excessively high with respect to the possible value range. In contrast, the second characteristic figure is reduced when the first characteristic figure is not close to the initial value with respect to its value range, and the sum of the value for the state of charge and of the second characteristic figure has a high value with respect to its value range.

This takes account of the fact that stratification of the state of charge also occurs in the continuing phase when electrolyte stratification has already started during charging. The state of charge stratification decreases again during charging, however, when the state of charge value and/or the second characteristic figure for the stratification of the state of charge is relatively large.

The first characteristic figure is reduced in the OVERCHARGING operating state. The second characteristic figure is reduced whenever the value of the first characteristic figure is in the region of the initial value, that is to say, there is not yet any significant electrolyte stratification. Specifically, the gas which is developed during OVERCHARGING swirls the electrolyte, so that the electrolyte stratification is reduced.

The second characteristic figure for the state of charge stratification is increased in the DISCHARGING operating state when the first characteristic figure has a very high value with respect to its value range, that is to say, when the electrolyte stratification is relatively large. This is because state of charge stratification does not take place before this during discharging.

The first characteristic figure is increased in the DISCHARGING operating state whenever the second characteristic figure is not close to the initial value with respect to its value range, and the value of the state of charge minus the value of the second characteristic figure is small with respect to the value range. This is based on the discovery that electrolyte stratification increases during discharging when the instantaneous state of charge value is lower than the previously lowest state of charge value since a largely fully charged state or a state in which the first characteristic figure has a small value with respect to its maximum value was last reached.

The first characteristic figure is reduced in the DISCHARGING operating state whenever the second characteristic figure has a significant value with respect to its value range, and the value of the state of charge minus the value of the second characteristic figure exceeds a minimum value range, and is not excessively small, with respect to the value range. This takes account of the fact that the electrolyte stratification during discharging decreases again when the state of charge stratification is considerable, or the state of charge value is high.

In the ZERO-CURRENT operating state, in which the energy storage battery is in the rest state, the first characteristic figure is reduced and the second characteristic figure is increased, that is to say, the electrolyte stratification automatically decreases in the rest state, but the state of charge stratification increases.

The time step $\Delta t$ should, as a maximum, be in the same order of magnitude of a time constant, which is characteristic of the type of energy storage battery, for the equalization of the acid density distributions at right angles to the electrodes, preferably in a range from one second to 30 minutes, that is to say, the time step $\Delta t$ is chosen as a function of how quickly electrolyte stratification is dissipated again from the energy storage battery during normal operation and in the normal operating state. The time steps $\Delta t$ should also be chosen such that the current into or out of the energy storage battery is largely constant during the respective time steps $\Delta t$.

A minimum value and/or a maximum value is preferably respectively defined for the first characteristic figure KS and the second characteristic figure KL. Restricting the values for the first and second characteristic figures to the respectively defined minimum and/or maximum values takes account of a state of the energy storage battery without stratification of the electrolyte concentration, with maximum stratification of the electrolyte concentration, without state of charge stratification, and with maximum state of charge stratification. The minimum value for the first characteristic figure in this case represents a value which must never be undershot when there is no stratification of the electrolyte concentration. The maximum value for the first characteristic figure KS is a value which must never be exceeded with maximum acid stratification and represents a characteristic variable for the energy storage battery for maximum stratification of the electrolyte concentration. The minimum value for the second characteristic figure KL is a value which must never be undershot when there is no state of charge stratification. The maximum value for the second characteristic figure KL is a value which must never be exceeded for maximum state of charge stratification, and represents a characteristic variable for the energy storage battery for maximum stratification of the state of charge of the electrodes.

The minimum value of the first characteristic figure KS is preferably the defined initial value for the first characteristic figure $KS_0$ for an as-new energy storage battery, and is preferably zero. A corresponding statement applies to the minimum value of the second characteristic figure KL.

The increase in the first characteristic figure KS for each time step $\Delta t$ in which charging has been identified is preferably proportional or more than proportional to the charge throughput $\Delta Q$ in this time step. This means that the increase is greater, the greater the charge throughput $\Delta Q$ in the time step $\Delta t$. In a corresponding manner, the increase in the first characteristic figure KS may also be proportional or more than proportional to the charge throughput rate $\Delta Q/\Delta t$ with the time step $\Delta t$.

Furthermore, it is advantageous for the increase in the first characteristic figure KS for each time step in which charging has been identified to be lower the higher the value of the first characteristic figure KS. This takes account of the effect that saturation is reached beyond a specific stratification level of the electrolyte concentration, at which further stratification of the electrolyte concentration takes place more slowly.

It is also advantageous for the first characteristic figure KS not to be increased for a charge throughput $\Delta Q$ in a time step $\Delta t$ which is below a defined lower limit value $Q_{min}$. This takes account of the fact that wear and stratification of the electrolyte concentration do not increase for charge levels below the lower limit value (which is characteristic of that energy storage battery type) for the charge throughput per time step. The amount of increase can also be limited in a corresponding manner to the increase for an upper limit value for the charge throughout per time step. This is because the stratification of the electrolyte concentration does not increase any further for charge throughputs per time step above the upper limit value.

It is, of course, completely the same when the first and second characteristic figures assume their maximum value in the initial state without electrolyte stratification and without state of charge stratification and are then reduced as the wear increases until they assume a minimum value for maximum stratification.

The first characteristic figure KS can preferably be used in order to predict the accelerated change in the rest voltage resulting from internal charge rearrangement. For this purpose, it is advantageous to calculate the gradient S of a characteristic curve of the rest voltage plotted against the charge throughput in order to predict the amount of charge which can be drawn, the change in voltage for a change in the electrical load or the absolute voltage for an assumed electrical load from a predetermined or learned relationship between the gradient and the first characteristic figure. The change in the rest voltage can likewise be predicted as a function of time on the basis of internal charge rearrangement processes between areas of the energy storage battery with different acid concentrations, with a predetermined or learnt temperature-dependent relationship between the rest voltage and the first characteristic figure.

Furthermore, a third characteristic figure KW can be provided, which is increased in the OVERCHARGING operating state. This third characteristic figure KW is used as a measure of the wear of the energy storage battery and can only rise starting from an initial value for each overcharging process and is never reduced, that is to say, the wear processes resulting from overcharging are regarded as being irreversible.

It is also possible to use known methods, which can now be extended with the aid of the first and the second characteristic figures KS and KL, by a measure for the extent of stratification. The increase in the first characteristic figure for net charging per time step, and the reduction in the first characteristic figure and the increase in the second characteristic figure for net discharging are in this case suitable for describing changes in the state and in the electrical behavior, as well as the wear of the energy storage battery over its life.

The first and second characteristic figures KS and KL which are obtained are used in order to initiate an action, for example a maintenance instruction or replacement instruction, for the control of a charging device, a pump or a temperature control device. The characteristic figures can also be used for prediction of the behavior of the energy store, in particular in order to predict the storage capability, the state of charge, the voltage response when loaded with currents, the voltage response on no-load (internal charge rearrangement) or the degree of wear. In this case, it is possible to use known methods, which can now be extended with the aid of the first and the second characteristic figures KS, KL by a measure for the extent of stratification.

Figure 1:
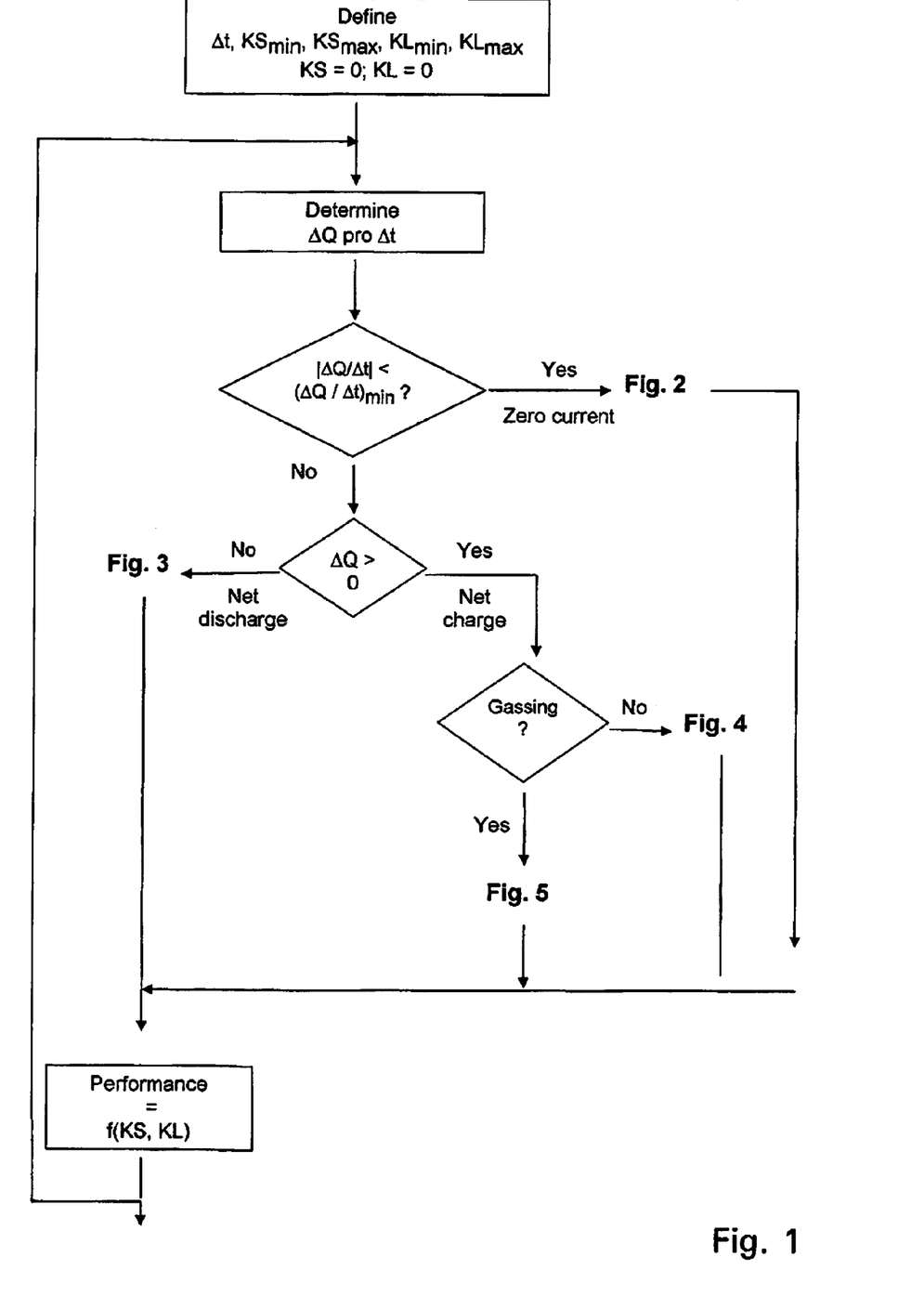
FIG. 1 shows a flowchart of a method according to an exemplary embodiment for determining at least one characteristic variable for the performance of an electrochemical energy storage battery.

FIG. 1 shows a flowchart of the method for determination of a first characteristic figure KS and of a second characteristic figure KL for assessment of the performance of an electrochemical energy storage battery.

In a first step, a time step $\Delta t$ is defined for the energy storage battery type. The order of magnitude of the time step $\Delta t$ is in the value range of the typical time constant for the equalization of acid density at right angles to the electrodes in the energy storage battery, and is between several tens of seconds and 30 minutes. It is advantageous, although not illustrated, for the time step $\Delta t$ to be matched during the course of the method to the respective temperature of the energy storage battery, by shortening the time step $\Delta t$ as the temperatures rise.

Furthermore, a minimum value $KS_{min}$ for the first characteristic figure KS, a maximum value $KS_{max}$ for the first characteristic figure KS, a minimum value $KL_{min}$ for the second characteristic figure KL and a maximum value $KL_{max}$ for the second characteristic figure KL are defined for the energy storage battery type. The minimum values $KS_{min}$ and $KL_{min}$ are in this case preferably set to zero in order to restrict the characteristic figures KS and KL to the corresponding value for the characteristic figures KS and KL for an as-new electrochemical energy store. The defined maximum value $KS_{max}$ for the first characteristic figure is set to a maximum value of the characteristic figure KS for maximum stratification of the electrolyte concentration in the electrochemical energy store. The maximum value $KL_{max}$ for the second characteristic figure KL is set to the maximum value for the second characteristic figure KL at which maximum stratification of the state of charge of the electrodes in the electrochemical energy store occurs.

The minimum and maximum values may be determined, for example, on the basis of experiments with energy storage batteries of the same type, and may then be predetermined for that energy storage battery type.

Before the energy storage battery is used for the first time (when there is still no stratification of the electrolyte concentration), the first characteristic figure KS and the second characteristic figure KL are set to their initial values $KS_0$ and $KL_0$, preferably to the value zero.

During the operation and life of the energy storage battery, the charge throughput $\Delta Q$ of the energy storage battery per defined time step $\Delta t$ is preferably determined continuously, although possibly also at intervals, for example, by current measurement, estimation, modeling, or the like. Upper and lower threshold values $(\Delta Q/\Delta t)_{min}$ and $(\Delta Q/\Delta t)_{max}$ which must not be exceeded may be taken into account. The charge throughput rate $\Delta Q/\Delta t$ is calculated from the charge throughout $\Delta Q$ per time step $\Delta t$. The threshold values $(\Delta Q/\Delta t)_{min}$ and $(\Delta Q/\Delta t)_{max}$ can also be taken into account on the basis of the charge throughput rate $\Delta Q/\Delta t$.

In a next step, a check is carried out to determine whether the magnitude of the charge throughput rate is below a defined limit value for the charge throughput rate $(\Delta Q/\Delta t)_{min}$. The limit value may, for example, be defined as the 1000-hour current. If the charge throughput rate $\Delta Q/\Delta t$ is below the limit value, a rest state is identified. The rest state may also optionally be assessed on a temperature-dependent basis, with the limit value for the charge throughput rate $(\Delta Q/\Delta t)_{min}$ preferably being set to be greater at low temperatures than at higher temperatures.

If no rest state has been identified, a check is carried out to determine whether the charge throughput $\Delta Q$ is greater than zero. If the charge throughput is greater than zero, normal electrical operation with net charging is identified, that is to say, the CHARGING operating state.

A check must then be carried out to determine whether OVERCHARGING is occurring, that is to say, whether the gassing criterion is satisfied. This may be done, for example, by assessment of the charging voltage, temperature, and duration of charging, possibly as well as the charging current.

The first and the second characteristic figures KS and KL are adapted, and the performance of the energy storage battery is determined, as a function of the ZERO-CURRENT, DISCHARGING, OVERCHARGING and CHARGING operating states.

Figure 2:
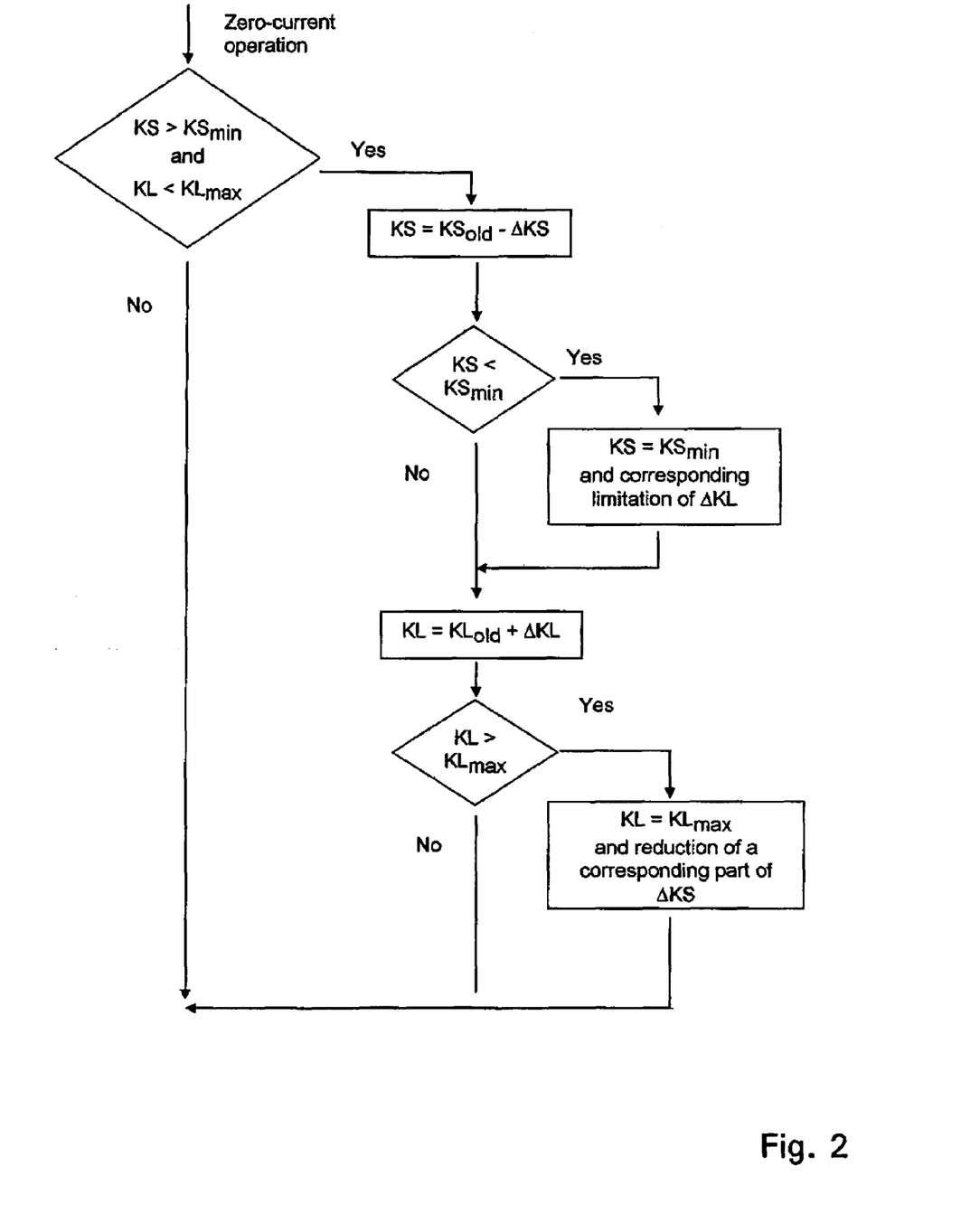
FIG. 2 shows a flowchart of the method in the ZERO-CURRENT operating state.

FIG. 2 shows the method for adaptation of the first and second characteristic figures KS and KL in the ZERO-CURRENT operating state. The first and the second characteristic figures KS and KL are changed only when the first characteristic figure KS is greater than the minimum value $KS_{min}$ and the second characteristic figure KL is less than the maximum value $KL_{max}$.

In the situation where the rest state has been identified, the value of the instantaneous first characteristic figure $KS_{old}$ is reduced by a value $\Delta KS$, as is sketched in FIG. 2, with the resultant first characteristic figure KS being limited to the defined minimum value $KS_{min}$. Furthermore, the second characteristic figure KL is increased by the value $\Delta KL$ and the second characteristic figure KL is likewise limited to the defined maximum value $KL_{max}$, which is never exceeded for maximum state of charge stratification.

The reduction $\Delta KS$ in the first characteristic figure KS and the increase $\Delta KL$ in the second characteristic figure KL per unit time $\Delta t$ resulting from charge rearrangement during the rest phase are greater the longer the time unit $\Delta t$, the greater the value of the first characteristic figure KS, and the higher the temperature T.

Figure 3:
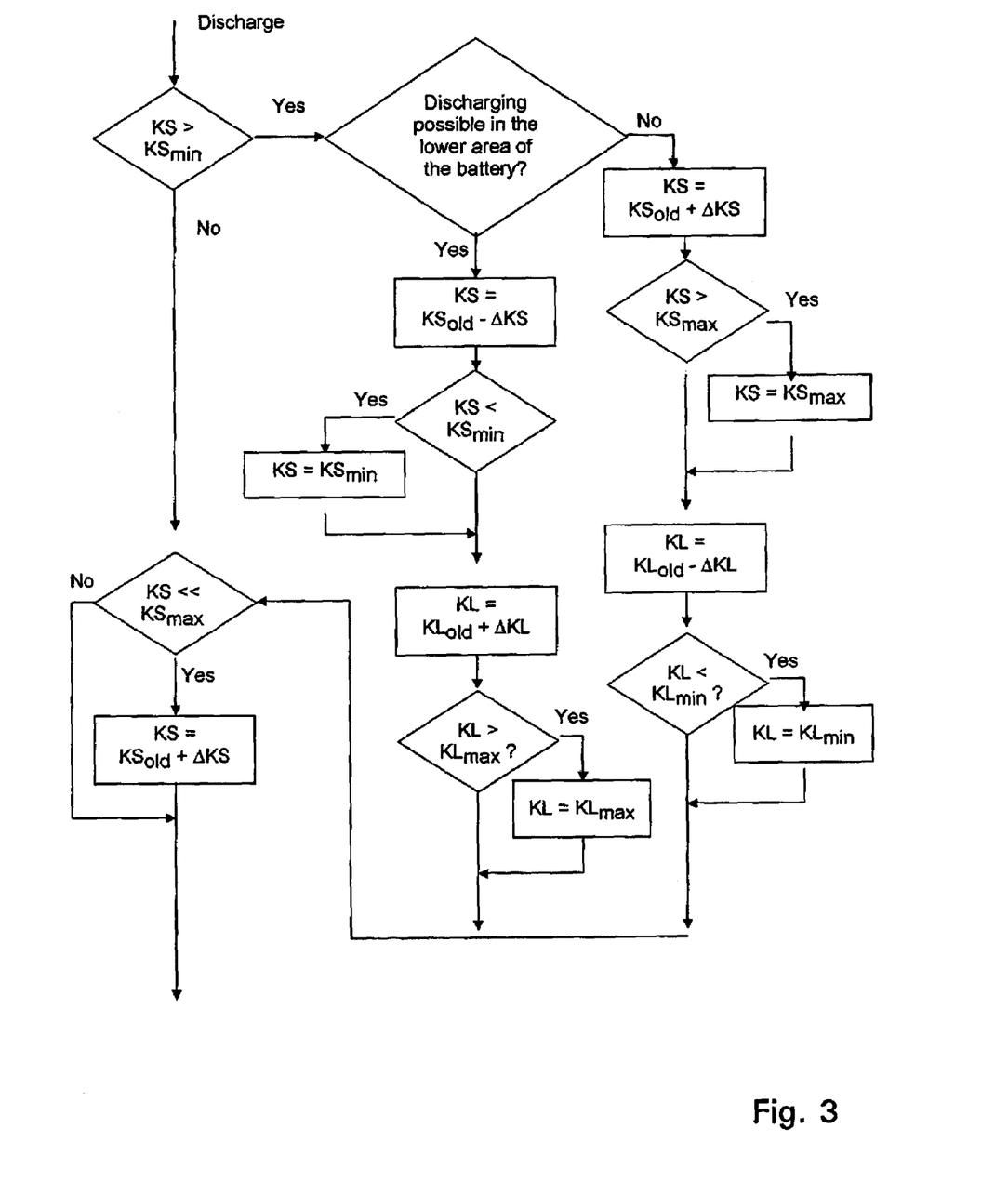
FIG. 3 shows a flowchart of the method in the DISCHARGING operating state.

FIG. 3 shows the method for adaptation of the first and the second characteristic figures KS and KL in the DISCHARGING operating state. If the first characteristic figure KS is less than or equal to the defined minimum value $KS_{min}$ and is considerably less than the defined maximum value $KS_{max}$, only the first characteristic figure KS is increased by the value $\Delta KS$ in a time step $\Delta t$. The second characteristic figure KL then remains unchanged.

In the situation where the first characteristic figure KS is greater than the minimum value $KS_{min}$, a check is carried out to determine whether discharging in the lower area of the battery is still possible.

In the normal situation in which the energy storage battery can also still be discharged further in the lower area, the first characteristic figure KS is reduced by the value $\Delta KS$ and, in this case, is limited in the downward direction to the defined minimum value $KS_{min}$. Furthermore, the second characteristic figure KL is increased by the value $\Delta KL$. The second characteristic figure KL is in this case limited to the defined maximum value $KL_{max}$, which is never exceeded for maximum state of charge stratification.

In the situation where no more discharging is possible in the lower area of the energy storage battery, the first characteristic figure KS is increased by the value $\Delta KS$ and the first characteristic figure KS is in this case limited to the maximum value $KS_{max}$. In this situation, it is assumed that the electrolyte concentration stratification has increased during discharging. In contrast, the value for the second characteristic figure KL is reduced by the value $\Delta KL$, with the resultant second characteristic figure KL being limited to the defined minimum value $KL_{min}$.

Figure 4:
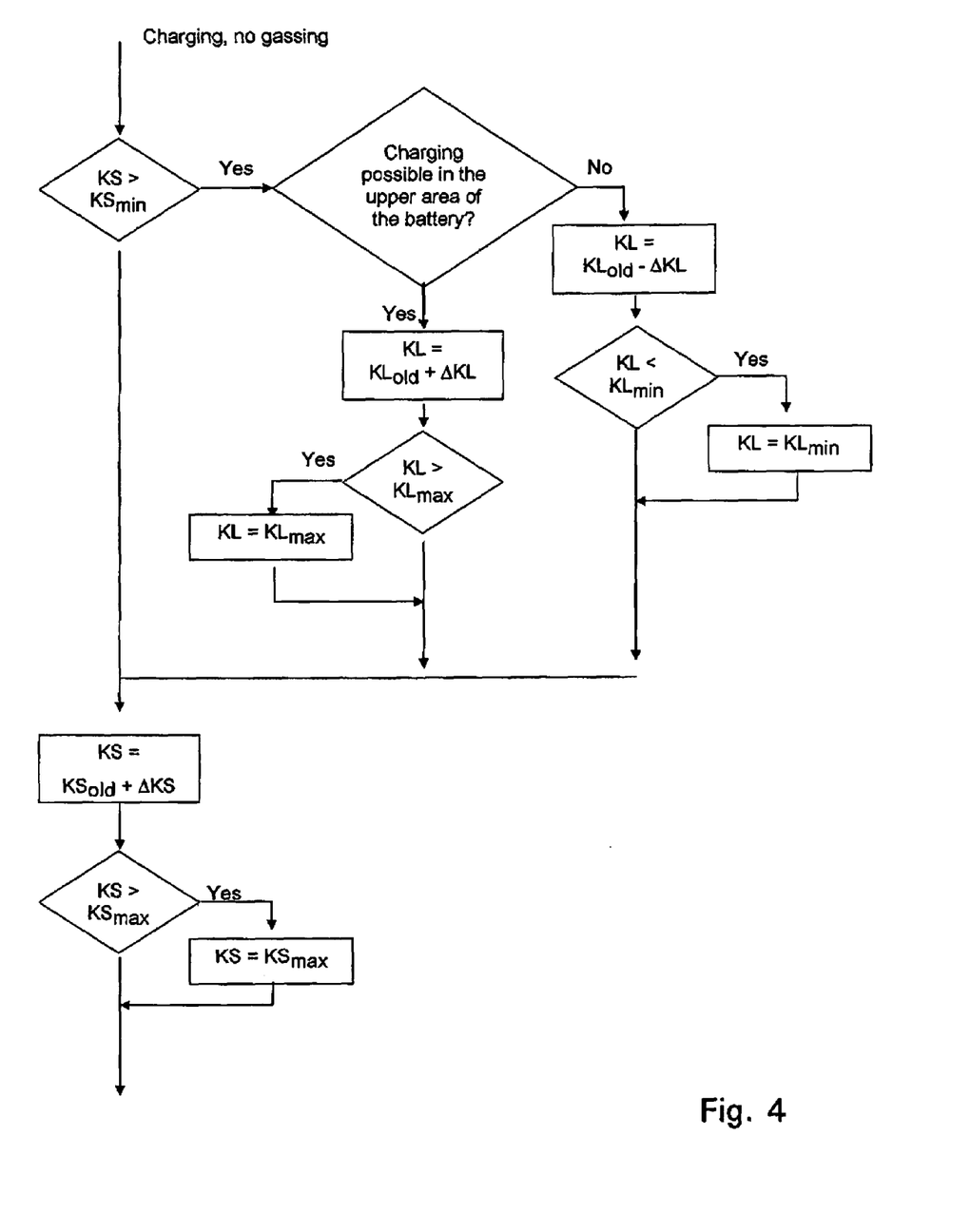
FIG. 4 shows a flowchart of the method in the CHARGING operating state.

FIG. 4 shows the method for adaptation of the first and second characteristic figures KS and KL in the charging situation, where no overcharging or gassing is occurring. In the situation where the first characteristic figure KS is less than or equal to the defined minimum value $KS_{min}$, only the first characteristic figure for electrolyte stratification is increased by the value $\Delta KS$. In this case, the first characteristic figure KS is limited to the defined maximum value $KS_{max}$.

Otherwise, a check is carried to determine whether charging is still possible in the upper area of the battery. If this is the case and the energy storage battery can be charged further without any risk of overcharging, the second characteristic figure KL is increased by the value $\Delta KL$. In this case, the second characteristic figure KL is limited to the defined maximum value $KL_{max}$, which is never exceeded for maximum state of charge stratification. Furthermore, the first characteristic figure KS is also increased by the value $\Delta KS$. The resultant first characteristic figure KS is also limited to the defined maximum value $KS_{max}$. An increase in the electrolyte concentration stratification and in the state of charge stratification of the electrodes is thus assumed for this normal charging situation.

In the situation where no more charging is possible in the upper area of the energy storage battery, the state of charge stratification decreases again in the CHARGING operating state. The second characteristic figure KL is thus reduced by the value $\Delta KL$, and the resultant second characteristic figure KL is limited to the defined minimum value $KL_{min}$. The first characteristic figure KS is in contrast increased by the value $\Delta KS$, and is limited to the fixed maximum value $KS_{max}$.

Figure 5:
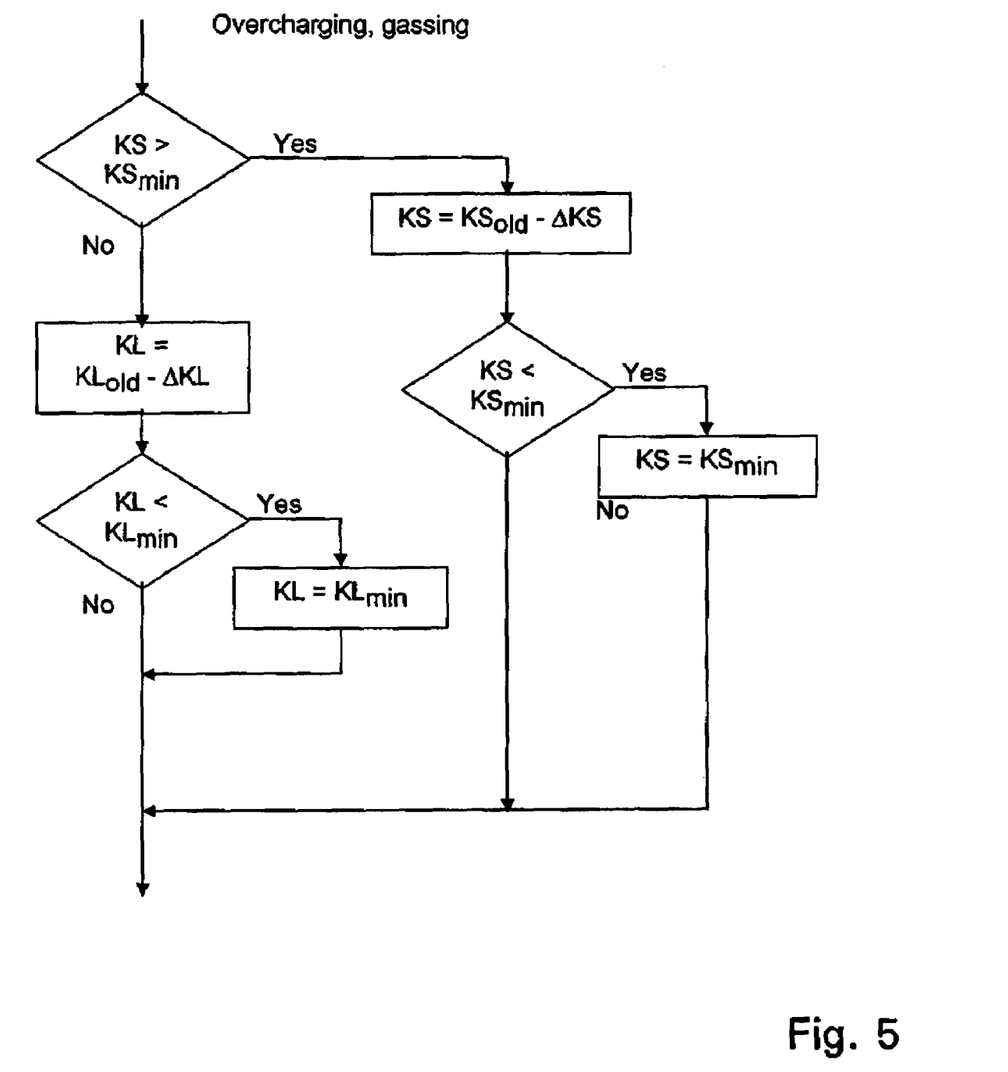

FIG. 5 shows the method in the OVERCHARGING or gassing operating state. In the situation in which stratification of the electrolyte concentration is already occurring, that is to say, the first characteristic figure KS is greater than the defined minimum value $KS_{min}$, the first characteristic figure KS is reduced by the value $\Delta KS$. In the case of overcharging, the electrolyte stratification is thus initially compensated for. In this situation, the first characteristic figure KS is once again limited to the defined minimum value $KS_{min}$.

For the situation in which there is no longer any significant stratification of the electrolyte concentration, that is to say, the first characteristic figure KS is close to the defined minimum value $KS_{min}$, the state of charge stratification is compensated for by reducing the second characteristic figure KL by the value $\Delta KL$. Once again, the second characteristic figure KL is limited to the minimum value $KL_{min}$. The method thus takes account of the effect that overcharging first of all compensates for the stratification of the electrolyte concentration, and then for the stratification of the state of charge.

Fundamentally, the first characteristic figure KS should be reduced $\Delta KS$ per time step $\Delta t$ to a greater extent the higher the charge throughput $\Delta Q$, the greater the change rate $\Delta Q/\Delta t$, the greater the value of the first characteristic figure KS, and the higher the temperature T.

The second characteristic figure KL should likewise be reduced by $\Delta KL$ per time step $\Delta t$ to a greater extent the higher the charge throughput $\Delta Q$, the greater the change rate $\Delta Q/\Delta t$, the greater the value of the second characteristic figure KL, and the higher the temperature T.

Figure 6:
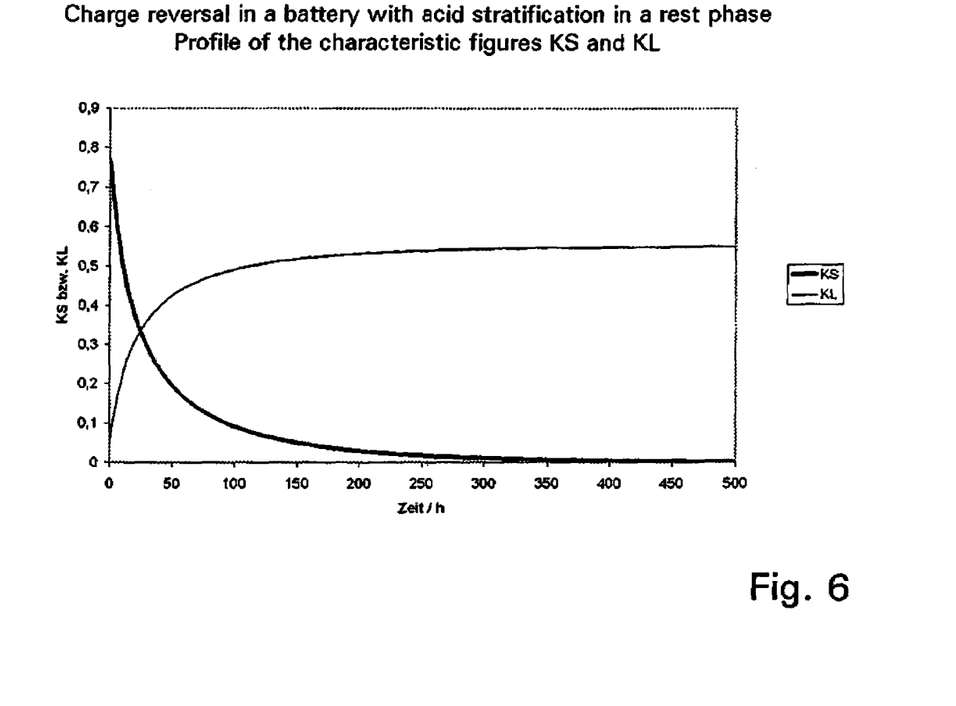
FIG. 6 shows an example of a graph for the development of the first and the second characteristic figure during a long ZERO-CURRENT operating state.
Figure 7:
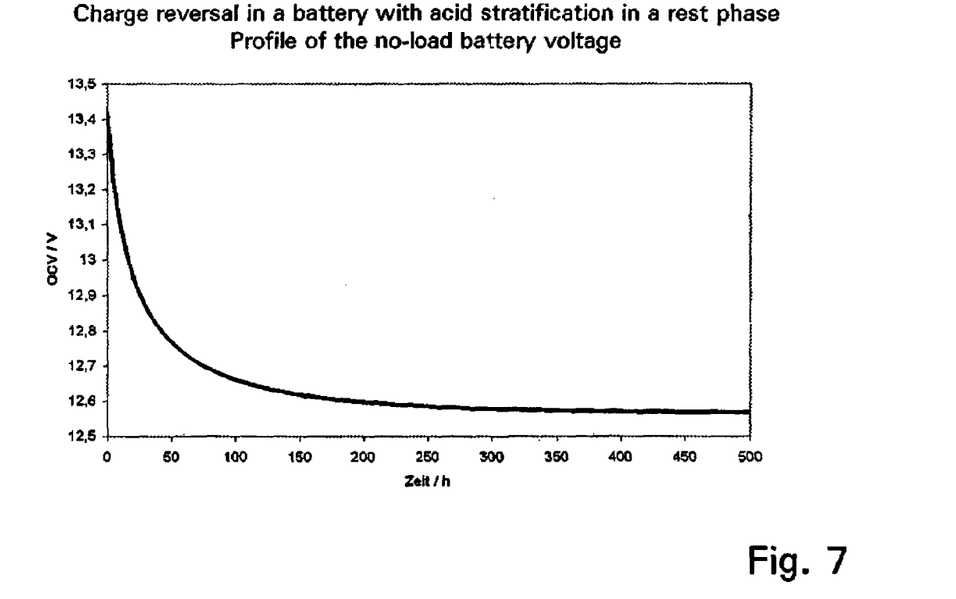
FIG. 7 shows an example of a graph for the development of the no-load battery voltage during a long phase in the "ZERO-CURRENT" operating state.

FIGS. 6 and 7 show examples of graphs for the development of the first and the second characteristic figure KS and KL, as well as the no-load battery voltage during a long zero-current phase. At the start of this phase in the ZERO- CURRENT operating state, there is considerable stratification of the electrolyte concentration in the energy storage battery, and this is responsible for the high rest voltage OCV. The first characteristic figure KS is reduced by internal charge rearrangement, while the second characteristic figure KL rises. This means that the stratification of the electrolyte concentration decreases, while the stratification of the state of charge in the electrodes increases. The rest voltage OCV falls accordingly.

In addition to the first and second characteristic figures, a further, third characteristic figure KW can also be defined, which is increased in the OVERCHARGING operating state. The third characteristic figure KW is used as a measure of the wear in the energy storage battery and can only rise starting from an initial value $KW_{min}$, preferably $KW_{min}$ equal to zero, and is never reduced.

Examples of the use of the first, second, and third characteristic figures KS, KL and KW that are obtained are quoted in the following text.

1) The characteristic figures KS, KL and KW which are obtained can be used directly in order to initiate an action, for example a maintenance instruction or replacement instruction, the control of a charging device, a pump or a temperature control device, etc.

1a) The comparison of one of the characteristic figures KS, KL and KW with appropriate threshold values can be used in order to request the operator of the unit which is connected to the energy storage battery to carry out a maintenance procedure. By way of example, deliberate (over)-charging is worthwhile in order to reduce the first and second characteristic figures KS and KL. A rising value of the third characteristic figure KW can be used to derive a need to replenish the electrolyte with water.

1b) The comparison of one of the characteristic figures KS, KL and KW with appropriate threshold values can be used in order to request the operator to replace the energy storage battery. This is worthwhile when maintenance within the sense of item 1a) is not possible or desirable, or has already proved to be futile or has been carried out repeatedly. If, by way of example, state of charge stratification has been present for a relatively long time, its rectification is in some circumstances no longer possible, or replacement is the more cost-effective alternative.

1c) The value of the first and the second characteristic figure KS or KL can be used in order to control the charging regime for the energy storage battery. Since the stratification of the electrolyte concentration and the stratification of the state of charge can be reduced, or their further rise can be avoided, by (over)charging, it is worthwhile increasing the charging voltage and/or the charging duration when the first and second characteristic figures KS or KL are rising. In the case of a motor vehicle, this can be achieved by controlling the generator voltage.

1 d) The value of the first and the second characteristic figure KS or KL can be used in order to control a process for through mixing of the electrolyte. This can be achieved, for example, by means of a pump which is installed in the energy storage battery and dissipates the stratification of the electrolyte concentration. This also makes it easier to dissipate the state of charge stratification.

1 e) The aqueous electrolyte in a lead-acid rechargeable battery starts to solidify at low temperatures. The freezing point depends on the local concentration. If this local concentration is inhomogeneous over the physical height, as in the case of stratification of the electrolyte concentration, then the solidification starts earlier in the upper cell area than with a homogeneous concentration. The value of the first characteristic figure KS can be used in order to indicate and to quantify this risk.

2) The first and second characteristic figures KS and KL which are obtained can also be used for prediction of the behavior of the energy store, in particular in order to predict the storage capability, the state of charge, the voltage response when loaded with currents, the voltage response in the no-load state (internal charge rearrangement) or the degree of wear. In this case, it is possible to use known methods, which can now be extended with the aid of the first and second characteristic figures KS and KL by a measure for the extent of stratification.

2a) The use of methods which produce satisfactory results only if the acid density is homogeneous can be suppressed as a function of the values of the characteristic figures KS, KL, and KW which are obtained. For example, this makes it possible to prevent a method which derives the state of charge of an energy storage battery from the rest voltage, deriving the state of charge in the presence of electrolyte stratification from the voltage values which are dominated by the lower electrode area where the electrolyte density is high, and thus incorrectly overestimating it.

2b) Methods which produce satisfactory results when the electrolyte density is homogeneous can be corrected as a function of the values of the characteristic figures KS, KL, and KW which are obtained. It is thus possible to extend a method which derives the state of charge SOC of an energy storage battery from the rest voltage $U_{00}$ by, for example, taking account of the first characteristic figure KS. To do this, by way of example, the voltage value which is dominated by the lower electrode area where the electrolyte density is high can be reduced, as an input value for the method, to a greater extent the greater the value of the first characteristic figure KS, which characterizes the electrolyte stratification.

2c) The use of methods which produce satisfactory results only when the electrolyte is not solid can be suppressed as a function of the values of the characteristic figures KS, KL, and KW which are obtained. It is thus possible to prevent a method which derives the state of charge SOC of an energy storage battery from the rest voltage $U_{OO}$, deriving, for example, the state of charge SOC when electrolyte stratification is present and solidification has started at a low temperature T from the voltage values which are dominated by the liquid electrolyte phase where the electrolyte density is high, and incorrectly overestimating it.

2d) It is possible to switch between different methods as a function of the characteristic figures KS, KL, and KW which are obtained. In the case of a lead-acid rechargeable battery, for example, the amount of charge which can be stored is thus generally determined by the quantity and the concentration of the electrolyte, because the active materials which are likewise involved in the electrochemical processes in the positive and negative electrodes are generally present in more than the necessary amounts. However, this is true only when the electrolyte is homogeneously distributed. In the presence of acid stratification, limiting mechanisms may act differently, and, in particular, may limit the available active electrode materials in the lower area. This effect becomes even stronger when state of charge stratification is also present.

3) Furthermore, the first characteristic figure KS can be used in order to predict the accelerated change in the rest voltage as a consequence of interal charge rearrangement, as is shown in FIGS. 6 and 7.

4) Furthermore, the time period of a state with a high first characteristic figure KS and second characteristic figure KL can be used as a measure for the no longer reversible sulfation, and as an input variable for the determination of irreversible capacity loss.

4a) When irreversible damage is assumed, a signal can also be set with the request for the energy storage battery to be maintained or replaced.

Various operating modes can thus be identified and evaluated by means of the method:

a) Types of cycles, operation, and battery states are identified which assist the formation of electrolyte stratification. In this case, a first characteristic figure KS which describes the degree of electrolyte stratification is determined, and the reduction in the storage capability resulting from electrolyte stratification Qv(KS) can be estimated. Furthermore, in this time, it is possible to take account of the possible corruption of the determination (which is derived from the rest voltage $U_{00}$) of a state of charge value SOC, of the on-load voltage derived from the rest voltage $U_{00}$, and of parameters derived from the rest voltage $U_{00}$, such as the internal resistance, etc.

b) Types of operation and battery states can be identified in which any electrolyte stratification which may be present across the physical height is dissipated again, and state of charge stratification (sulfate stratification) over the physical height of the electrodes is converted. In this case, a second characteristic figure KL is determined, which describes the degree of state of charge stratification. During this time, it is also possible to estimate the reduction and, after this if appropriate, the disappearance of the corruption of the determination (which is derived from the rest voltage $U_{00}$) of a state of charge value SOC. However, in this case, a change in the characteristics and the behavior of the energy storage battery still remains, for example a reduction in the storage capability as a result of state of charge stratification Qv(KL).

c) It is possible to identify operating modes which once again cancel out any electrolyte or sulfate stratification which may already be present, such as severe overcharging. The dissipation of the first and second characteristic figures KS and KL as well as the reduction in the storage capability caused by electrolyte stratification Qv(KS) and state of charge stratification Qv(KL) can also be estimated in this time.

d) The information about the extent of electrolyte stratification in the acid S and the extent of stratification in the state of charge of the electrodes can be used in order to determine the instantaneous storage capability CSC, in order to predict the amount of charge which can be drawn at that time, in order to predict the voltage response when load changes occur, and in order to estimate irreversible aging processes, for example sulfation etc.

The method is based on the following relationships relating to the behavior of an energy storage battery:

1. Electrolyte stratification occurs during charging when a relatively large net amount of charge $\Delta Q$ is introduced in a time interval $\Delta t$. The stratification in the electrolyte is identified and is weighted with a first characteristic figure KS. For the new state, in which there is no stratification, the first characteristic figure KS is generally set to the value zero. The extent of electrolyte stratification does not exceed a maximum value $KS_{max}$. The rise in the electrolyte stratification $\Delta KS$ increases with the charge throughput rate $\Delta Q/\Delta t$, that is to say with the mean current, with a specific maximum value of the rise in the stratification $\Delta KS$ per time step $\Delta t$ not being exceeded. In contrast, very low charge throughput rates $\Delta Q/\Delta t$ do not lead to any increase in the stratification. The rise $\Delta KS$ in the electrolyte stratification increases with the absolute amount of charge $\Delta Q$, although a specific maximum value of the rise in the electrolyte stratification $\Delta KS$ per unit time $\Delta t$ is not exceeded in some circumstances. Very small amounts of charge $\Delta Q$ in contrast do not lead to any increase in the stratification.

2. The time step $\Delta t$ for the smoothing of the charge throughput rate $\Delta Q/\Delta t$ and of the charge throughput $\Delta Q$ is in the same order of magnitude as the typical time constant for equalization of the electrolyte density at right angles to the electrodes. At high temperatures, the time step $\Delta t$ is, for example, about one minute. At very low temperatures, it is about ten minutes.

3. When the state of charge is low, that is to say the electrolyte density in the area between the plates is low, it is technically easier to carry out charging at a higher charge throughput rate $\Delta Q/\Delta t$. The amount of charge $\Delta Q$ supplied can also be higher. Both assist the formation of stratification and are taken into account just by determination of the charging current.

4. In addition, electrolyte stratification can also occur when dense acid falls downwards from the cell area above the electrodes through the plate block in the energy storage battery without being consumed there. However, starting from a state with a low first characteristic figure KS, this occurs only once, to be precise when so much charge $\Delta Q$ is discharged (for example more than about 10% of the capacity) for the first time with at least a medium current (for example more than the 10-hour current $i_{10}$) from a relatively high initial state of charge value SOC that the overstratification with denser acid becomes unstable and falls downwards. If discharging in contrast takes place at a lower current, then the acid is consumed on its downward path without increasing the stratification.

Possible criteria for the situation in which the first characteristic figure KS increases during discharging are:
(i) the first characteristic figure KS has a low value with respect to its maximum value $KS_{max}$;
(ii) the state of charge SOC is actually below the low state of charge $SOC_{min}$ which was assumed since last reaching
 a) the approximate full charge or
 b) a lower value of the first characteristic figure with respect to the maximum value $KS_{max}$ of the first characteristic figure.

5. At low temperatures, the current distribution over the pore depth is more homogeneous and the viscosity of the acid is higher, so that stratification of the electrolyte concentration occurs less easily there, or is less pronounced. The functions $\Delta KS=f(\Delta Q/t)$, $\Delta KS=f(\Delta Q)$, $\Delta KL=f(\Delta Q/t)$, $\Delta KL=f(\Delta Q)$ etc. are therefore preferably temperature-dependent such that the changes at low temperatures are reduced.

6. The stratification in the electrolyte is in general decreased by discharging or by (zero-current) rest times. During discharging, the higher concentration in the lower area decreases, with the concentration there being matched to the concentration in the upper area. In the rest times, the higher concentration in the lower area is decreased, while at the same time being increased in the upper area, thus likewise resulting in equalization. In both situations, stratification in the state of charge which is described by the second characteristic figure KL is decreased. The value of the second characteristic figure KL is preferably limited to a maximum value $KL_{max}$.

The stratification in the state of charge KL may, however, not fall below the minimum value $KL_{min}$ for an as-new energy storage battery, for which $KL_{min}$ is preferably 0.

7. The stratification in the electrolyte is likewise decreased by overcharging with gassing. In this case as well, the stratification described by the first characteristic figure KS cannot fall below the minimum value $KS_{min}$ for an as-new energy storage battery, preferably $KS_{min}=0$.

8. If the stratification in the electrolyte has once again at least approximately reached the minimum value $KS_{min}$ for an as-new energy storage battery as a result of overcharging with gassing, then stratification in the state of charge, as described by the second characteristic figure KL, can also be decreased again. The stratification and the value of the second characteristic figure KL which describes the stratification may, however, not fall below the minimum value $KL_{min}$ for an as-new energy storage battery, preferably $KL_{min}=0$.

Since gassing is caused by electrolysis, which is associated with loss of water, a further characteristic figure KW which describes the loss of water can optionally be introduced. However, this can only increase from a fixed minimum value $KW_{min}$ for an as-new energy storage battery, preferably $KW_{min}=0$, and cannot be decreased again, unless a maintenance operation is carried out by replenishment with water. The third characteristic figure KW is a variable which characterizes the wear to the energy storage battery.

It is important to note that the various exemplary embodiments are illustrative only. Although only a few embodiments of the present inventions have been described in detail in this disclosure, those skilled in the art who review this disclosure will readily appreciate that many modifications are possible without materially departing from the novel teachings and advantages of the subject matter recited in the claims. Accordingly, all such modifications are intended to be included within the scope of the present invention as defined in the appended claims. The order or sequence of any process or method steps may be varied or re-sequenced according to alternative embodiments. Other substitutions, modifications, changes and omissions may be made in the design, operating conditions and arrangement of the exemplary embodiments without departing from the scope of the present inventions as expressed in the appended claims.

What is claimed is:

1. A method for determining at least one characteristic variable for the state of an electrochemical energy storage battery comprising:
   determining the charge throughput ($\Delta Q$) of the energy storage battery per time step ($\Delta t$);
   determining a first characteristic figure (KS) in order to describe the stratification of the electrolyte concentration in the energy storage battery on the basis of a defined initial state ($KS_0$) for an as-new energy storage battery;
   determining a second characteristic figure (KL) in order to describe the stratification of the state of charge (SOC) in the energy storage battery on the basis of a defined initial value ($KL_0$) for an as-new energy storage battery during operation of the energy storage battery;
   in each time step ($\Delta t$), adapting the first characteristic figure (KS) and the second characteristic figure (KL) as a function of the charge throughput ($\Delta Q$) from the instantaneous state of the energy storage battery, which is characterized by the state of charge of the electrodes, the electrolyte concentration in the energy storage battery and the first and second characteristic figures (KS, KL); and
   determining at least one characteristic variable from the first and the second characteristic figures (KS, KL).

2. The method as claimed in claim 1 wherein a distinction is drawn between at least two of the following operating phases for adaptation of the first and the second characteristic figure (KS, KL):
   a) ZERO-CURRENT, when the magnitude of the charge throughput ($\Delta Q$) per time step ($\Delta t$) is less than a threshold value (($\Delta Q/\Delta t)_{min}$);
   b) DISCHARGING, when the charge throughput ($\Delta Q$) per time step ($\Delta t$) is negative and whose magnitude is greater than the threshold value (($\Delta Q/\Delta t)_{min}$);
   c) CHARGING, when the charge throughput ($\Delta Q$) per time step ($\Delta t$) is positive and its magnitude is greater than the threshold value (($\Delta Q/\Delta t)_{min}$) and OVERCHARGING is not occurring; and
   d) OVERCHARGING, when the charge throughput ($\Delta Q$) per time step ($\Delta t$) is positive and its magnitude is greater than the threshold value (($\Delta Q/\Delta t)_{min}$) and, at the same time, the first characteristic figure (KS) is in the vicinity of the initial value ($KS_0$) with respect to the value range, or when gas development which exceeds a defined gassing threshold value is identified from the charge throughput ($\Delta Q$) and the state of charge (SOC) of the energy storage battery.

3. The method as claimed in claim 2 wherein the threshold value ($\Delta Q_{min}$) is less than the 20-hour current ($I_{20}$) of the energy storage battery.

4. The method as claimed in claim 2 wherein the threshold value ($\Delta Q_{min}$) is less than the 100-hour current ($I_{100}$) of the energy storage battery.

5. The method as claimed in claim 2 wherein the first characteristic figure (KS) is increased in the CHARGING operating state.

6. The method as claimed in claim 2 wherein the second characteristic figure (KL) is increased in the CHARGING operating state when
   a) the first characteristic figure (KS) is not close to the initial value ($KS_0$) with respect to its possible value range, and
   b) the sum of the value for the state of charge (SOC) and of the second characteristic figure (KL) has a value which is not excessively high with respect to the possible value range.

7. The method as claimed in claim 2 wherein the second characteristic figure (KL) is reduced in the CHARGING operating state when
   a) the first characteristic figure (KS) is not close to the initial value ($KS_0$) with respect to its value range, and
   b) the sum of the value for the state of charge (SOC) and of the second characteristic figure (KL) has a high value with respect to its value range.

8. The method as claimed in claim 2 wherein the first characteristic figure (KS) is reduced in the OVERCHARGING operating state.

9. The method as claimed in claim 2 wherein the second characteristic figure (KL) is reduced in the OVERCHARGING operating state when the value of the first characteristic figure (KS) is in the region of the initial value ($KS_0$).

10. The method as claimed in claim 2 wherein the second characteristic figure (KL) is increased in the DISCHARGING operating state when the first characteristic figure (KS) has a high value with respect to its value range.

11. The method as claimed in claim 2 wherein the first characteristic figure (KS) is increased in the DISCHARGING operating state when
 a) the second characteristic figure (KL) is not close to the initial value ($KL_0$) with respect to its value range, and
 b) the value of the state of charge (SOC) minus the value of the second characteristic figure (KL) is small with respect to the value range.

12. The method as claimed in claim 2 wherein the first characteristic figure (KS) is reduced in the DISCHARGING operating state when
 a) the second characteristic figure (KL) has a considerable value with respect to its value range, and
 b) the value of the state of charge (SOC) minus the value of the second characteristic figure (KL) exceeds a minimum value range, and is not excessively small, with respect to the value range.

13. The method as claimed in claim 2 wherein the first characteristic figure (KS) is reduced and the second characteristic figure (KL) is increased in the ZERO-CURRENT operating state.

14. The method as claimed in claim 2 wherein the first characteristic figure (KS) is increased in the DISCHARGING operating state when an instantaneous value for the state of charge (SOC) is lower than the previously lowest value for the state of charge (SOC) since the following was last reached:
 a) a state of largely complete charging, or
 b) a state in which the first characteristic figure (KS) is close to the initial value ($KS_0$) with respect to the value range.

15. The method as claimed in claim 2 wherein the first characteristic figure (KS) is increased in the DISCHARGING operating state when the first characteristic figure (KS) is close to the initial value ($KS_0$) with respect to the value range.

16. The method as claimed in claim 15 wherein the increase ($\Delta KS$) in the first characteristic figure (KS) for each time step ($\Delta t$) in which the CHARGING operating state was identified is proportional to or more than proportional to the charge throughput ($\Delta Q$) in this time step ($\Delta t$).

17. The method as claimed in claim 15 wherein the increase ($\Delta KS$) in the first characteristic figure (KS) for the time step ($\Delta t$) in the CHARGING operating state decreases the higher the value of the first characteristic figure (KS).

18. The method as claimed in claim 1 wherein the time step ($\Delta t$) is, as a maximum, in the same order of magnitude as a time constant, which is characteristic of the type of energy storage battery, for the equalization of the electrolyte density distributions at right angles to the electrodes.

19. The method as claimed in claim 1 wherein the time step ($\Delta t$) is in a range from 1 second to 30 minutes.

20. The method as claimed in claim 1 wherein the current (I) into or out of the energy storage battery is largely constant during the respective time steps ($\Delta t$).

21. The method as claimed in claim 1 further comprising defining at least one of a lower minimum value and an upper maximum value for at least one of the first characteristic figure (KS) and the second characteristic figure (KL), and restricting the values for the characteristic figures (KS, KL) to the respectively defined minimum and maximum values.

22. The method as claimed in claim 21 wherein the minimum value of the first characteristic figure (KS) is the defined initial value ($KS_0$) for an as-new energy storage battery.

23. The method as claimed in claim 21 wherein the minimum value of the second characteristic figure (KL) is the defined initial value ($KL_0$) for an as-new energy storage battery.

24. The method as claimed in claim 21 wherein the maximum value for the first characteristic figure (KS) is a characteristic variable for the energy storage battery for the maximum stratification of the electrolyte concentration.

25. The method as claimed in claim 21 wherein the maximum value for the second characteristic figure (KL) is a characteristic variable for the energy storage battery for the maximum stratification of the state of charge of the electrodes.

26. The method as claimed in claim 1 further comprising calculating a characteristic curve for the rest voltage ($U_{00}$) of the battery plotted against the charge throughput ($\Delta Q$) from at least one of the first and second characteristic figures (KS, KL) in order to predict at least one of the state, the behavior, and the performance of the energy store.

27. The method as claimed in claim 1 further comprising predicting at least one of the state, the behavior, and the performance of the energy store, in order to predict at least one of the storage capability, the state of charge, the amount of charge which can be drawn, the voltage response when loaded with currents, the voltage response on no-load, the degree of wear, the change in voltage for a change in the electrical load, and the absolute voltage for an assumed electrical load using a functional relationship taking into account the value of the first characteristic figure (KS) and of the second characteristic figure (KL).

28. The method as claimed in claim 1 further comprising predicting the change in the rest voltage ($U_{00}$) of the battery as a function of the time (t) on the basis of internal charge-reversal processes between areas of the energy storage battery with different electrolyte concentrations and with a predetermined or learned relationship between the rest voltage ($U_{00}$), the first characteristic figure (KS), and the second characteristic figure (KL).

29. The method as claimed in claim 2 wherein a third characteristic figure (KW) is increased in the OVERCHARGING operating state, in which case the third characteristic figure (KW) can only rise and is never reduced starting from an initial value ($KW_{min}$), and in which case the third characteristic figure (KW) is used as a measure of the wear of the energy storage battery.

30. The method as claimed in claim 29 wherein at least one of the first, second, and third characteristic figures (KS, KL, KW) is indicated in order to initiate an action.

31. The method as claimed in claim 30 wherein the action comprises regulating at least one of a charging device, a pump, and a temperature control device.

32. The method as claimed in claim 29 wherein at least one of the characteristic figures (KS, KL, KW) obtained is logically linked with another method for determination or prediction of at least one of the state and of the behavior of an energy storage battery in order to predict the storage capability, the state of charge, the voltage response when loaded with currents, or the degree of wear.

33. The method as claimed in claim 32 wherein the logical link with another method also includes result variables from this other method in the determination of the characteristic figures (KS, KL, KW).

34. A monitoring device for an energy storage battery having a unit for determining the charge throughput ($\Delta Q$) of the energy storage battery and having evaluation means, wherein the evaluation means are designed to carry out a method comprising:
 determining the charge throughput ($\Delta Q$) of the energy storage battery per time step ($\Delta t$);
 determining a first characteristic figure (KS) in order to describe the stratification of the electrolyte concentration in the energy storage battery on the basis of a defined initial state ($KS_0$) for an as-new energy storage battery;

determining a second characteristic figure (KL) in order to describe the stratification of the state of charge (SOC) in the energy storage battery on the basis of a defined initial value ($KL_0$) for an as-new energy storage battery during operation of the energy storage battery;

in each time step ($\Delta t$), adapting the first characteristic figure (KS) and the second characteristic figure (KL) as a function of the charge throughput ($\Delta Q$) from the instantaneous state of the energy storage battery, which is characterized by the state of charge of the electrodes, the electrolyte concentration in the energy storage battery and the first and second characteristic figures (KS, KL); and determining at least one characteristic variable from the first and the second characteristic figure (KS, KL).

* * * * *